US012308206B2

(12) United States Patent
Park, Jr. et al.

(10) Patent No.: US 12,308,206 B2
(45) Date of Patent: May 20, 2025

(54) THREE LAYER RESONATOR COIL FOR LINEAR ACCELERATOR

(71) Applicant: Applied Materials, Inc., Santa Clara, CA (US)

(72) Inventors: William Herron Park, Jr., Marblehead, MA (US); Charles T. Carlson, Cedar Park, TX (US); Luke Bonecutter, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 428 days.

(21) Appl. No.: 17/993,566

(22) Filed: Nov. 23, 2022

(65) Prior Publication Data

US 2024/0170251 A1 May 23, 2024

(51) Int. Cl.
*H01J 37/317* (2006.01)
*C23C 14/48* (2006.01)

(52) U.S. Cl.
CPC .......... *H01J 37/3171* (2013.01); *C23C 14/48* (2013.01); *H01J 2237/0473* (2013.01)

(58) Field of Classification Search
USPC ...................... 250/396 ML, 492.21
See application file for complete search history.

(56) References Cited

U.S. PATENT DOCUMENTS

2021/0210307 A1\* 7/2021 Biloiu ..................... H01P 7/005

\* cited by examiner

*Primary Examiner* — Kiet T Nguyen
(74) *Attorney, Agent, or Firm* — KDW Firm, PLLC

(57) ABSTRACT

An ion implantation system including an ion source for generating an ion beam, an end station for holding a substrate to be implanted by the ion beam, and a linear accelerator disposed between the ion source and the end station and adapted to accelerate the ion beam, the linear accelerator including at least one acceleration stage including a resonator and a resonator coil disposed within a resonator chamber, wherein the resonator coil is a tubular body having a plurality of coaxial layers, including an inner layer, a middle layer, and an outer layer, wherein the outer layer is formed of a dielectric material.

20 Claims, 4 Drawing Sheets

THREE LAYER RESONATOR COIL FOR LINEAR ACCELERATOR

FIELD OF THE DISCLOSURE

The disclosure relates generally to ion implantation apparatus and more particularly to a resonator coil for linear accelerators.

BACKGROUND OF THE DISCLOSURE

Ion implantation is a process of introducing dopants or impurities into a substrate via ionic bombardment. A typical ion implantation system may include an ion source and a series of beam-line components. The ion source may include a chamber where ions are generated. One type of ion implanter suitable for generating ion beams of medium energy and high energy employs a linear accelerator, or LINAC, where a series of AC or RF electrodes are arranged as tubes around an ion beam and accelerate the ion beam to increasingly higher energies along the succession of tubes. The various electrodes may be arranged in a series of stages, where a given electrode in a given stage receives an AC voltage signal to accelerate the ion beam.

A RF LINAC employs a high frequency drive signal to generate high voltage at one or more RF electrodes in a given stage of the LINAC via a resonator coil. An initial RF power signal may be provided to an RF exciter at a relatively lower voltage, such as several hundred volts. The voltage amplitude of this RF power signal is amplified though the resonator coil, which may output a high voltage to an RF electrode at voltages in the range of tens of keV. In particular, as the RF power signal is propagated through the resonator coil, the maximum amplitude of the voltage increases toward the coil ends that are proximate the RF electrodes.

Resonator coils for LINACs are typically formed of bare copper tubing. Copper tubing is used because it is easily bendable/formable and has good electrical and thermal conductivity. A disadvantage associated with copper tubing is low stiffness and a resulting susceptibility to vibration, creating a potential for beam loss and energy spread. Additionally, bare copper is susceptible to sputtering and thus presents a risk of metal contamination to a downstream substrate.

With respect to these and other considerations, the present disclosure is provided.

BRIEF SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An ion implantation system in accordance with an exemplary embodiment of the present disclosure may include an ion source for generating an ion beam, an end station for holding a substrate to be implanted by the ion beam, and a linear accelerator disposed between the ion source and the end station and adapted to accelerate the ion beam, the linear accelerator including at least one acceleration stage including a resonator and a resonator coil disposed within a resonator chamber, wherein the resonator coil is a tubular body having a plurality of coaxial layers, including an inner layer, a middle layer, and an outer layer, wherein the outer layer is formed of a dielectric material.

A linear accelerator in accordance with an exemplary embodiment of the present disclosure may include at least one acceleration stage including a resonator and a resonator coil disposed within a resonator chamber, wherein the resonator coil is a tubular body having a plurality of coaxial layers, including an inner layer, a middle layer, and an outer layer, wherein the outer layer is formed of a dielectric material.

A resonator coil in accordance with an exemplary embodiment of the present disclosure may include a tubular body having a plurality of coaxial layers, including an inner layer, a middle layer, and an outer layer, wherein the inner layer is formed of one of stainless steel, aluminum, and titanium, the middle layer is formed of copper, and the outer layer is formed of a dielectric material.

BRIEF DESCRIPTION OF THE DRAWINGS

The accompanying drawings illustrate exemplary approaches of the present disclosure, including the practical application of the principles thereof, as follows:

FIG. 2 is a side view illustrating an acceleration stage in accordance with an exemplary embodiment of the present disclosure;

Figure 1:
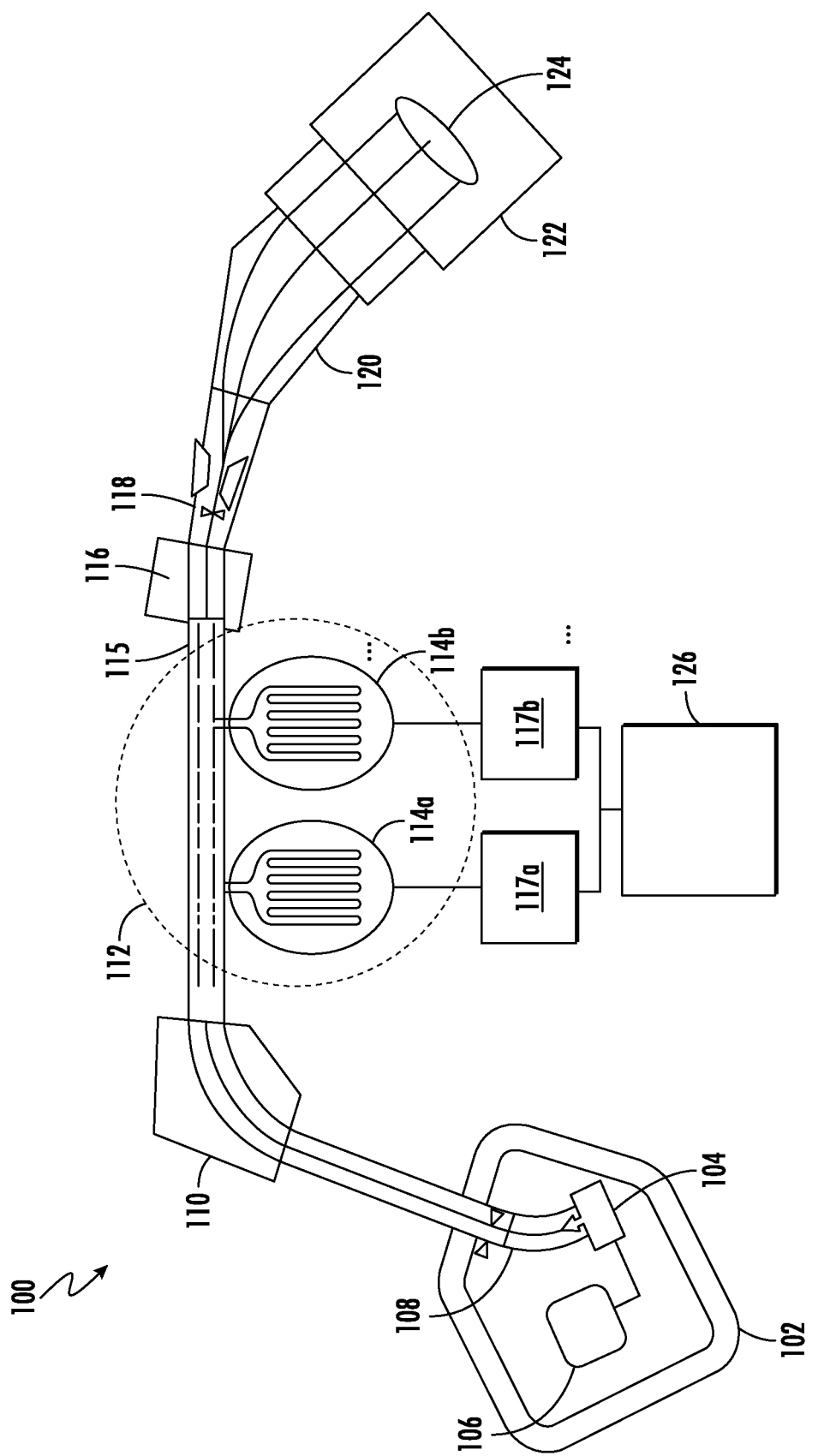
FIG. 1 is a schematic view illustrating an ion implantation system in accordance with an exemplary embodiment of the present disclosure.

The drawings are not necessarily to scale. The drawings are merely representations, not intended to portray specific parameters of the disclosure. The drawings are intended to depict exemplary embodiments of the disclosure, and thus are not to be considered as limiting in scope. In the drawings, like numbering represents like elements.

DETAILED DESCRIPTION

Systems and apparatus in accordance with the present disclosure will now be described more fully hereinafter with reference to the accompanying drawings, where embodiments of the systems and apparatus are shown. The systems and apparatus may be embodied in many different forms and are not to be construed as being limited to the embodiments set forth herein. Instead, these embodiments are provided so this disclosure will be thorough and complete, and will fully convey the scope of the systems and apparatus to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Referring to FIG. 1, a schematic view illustrating an ion implantation system 100 according to embodiments of the present disclosure is shown. The ion implantation system 100 may represent a beamline ion implanter, with some elements omitted for clarity of explanation. The ion implantation system 100 may include an ion source 102 including an ion chamber 104 and a gas box 106 held at high voltage as known in the art. The ion chamber 104 may include extraction components and filters (not shown) configured to generate an ion beam 108 at a first energy. Examples of suitable ion energies for the first ion energy range from 5 keV to 100 keV. The present disclosure is not limited in this regard. To form a high energy ion beam, the ion implantation system 100 may include various additional components for accelerating the ion beam 108 as further discussed below.

The ion implantation system 100 may include an analyzer 110 adapted to receive and analyze the ion beam 108. Thus, in some embodiments, the analyzer 110 may receive the ion beam 108 with an energy imparted by extraction optics located at the ion chamber 104, where the ion energy is in the range of 100 keV or below, and, in particular, 80 keV or below. In other embodiments, the analyzer 110 may receive the ion beam 108 accelerated by a DC accelerator column to higher energies such as 200 keV, 250 keV, 300 keV, 400 keV, or 500 keV. The embodiments are not limited in this context. The ion implantation system 100 may also include a linear accelerator 112, disposed downstream of the analyzer 110. The linear accelerator 112 may include a plurality of accelerator stages, arranged in series, as represented by resonators 114a, 114b in FIG. 1, and the resonators 114a, 114b may be powered by respective, dedicated RF sources, shown as RF sources 117a, 117b, as further discussed below.

A given stage of the linear accelerator 112 may be driven by a given resonator, generating an AC voltage signal in the MHz range (RF range), where the AC voltage signal generates an AC field at an electrode of the given stage. The AC field acts to accelerate the ion beam 108, wherein the ion beam 108 may be delivered to the stages in packets as a bunched ion beam. A buncher, not separately shown, may be located upstream of the linear accelerator 112 or may be located at a first stage of the linear accelerator 112, to receive a continuous ion beam and generate a bunched ion beam by action of an RF resonator at the buncher. The accelerator stages may act similarly to the buncher, to output bunched ion beams at a given stage, and to accelerate the ion beam 108 to a higher energy in stages. Thus, a buncher may be considered to be a first accelerator stage, differing from downstream accelerator stages in that the ion beam 108 is received as a continuous ion beam in the buncher.

In various embodiments, the ion implantation system 100 may include additional components, such as a filter magnet 116, a scanner 118, and collimator 120, where the general functions of the filter magnet 116, scanner 118, and collimator 120 are well known and will not be described herein in further detail. As such, a high energy ion beam, represented by the high energy ion beam 115, after acceleration by the linear accelerator 112, may be delivered to an end station 122 of the ion implantation system 100 for processing of a substrate 124. In various embodiments, a given acceleration stage of the linear accelerator 112 may be coupled to, or may include, a controller 126, as described below.

Figure 2:
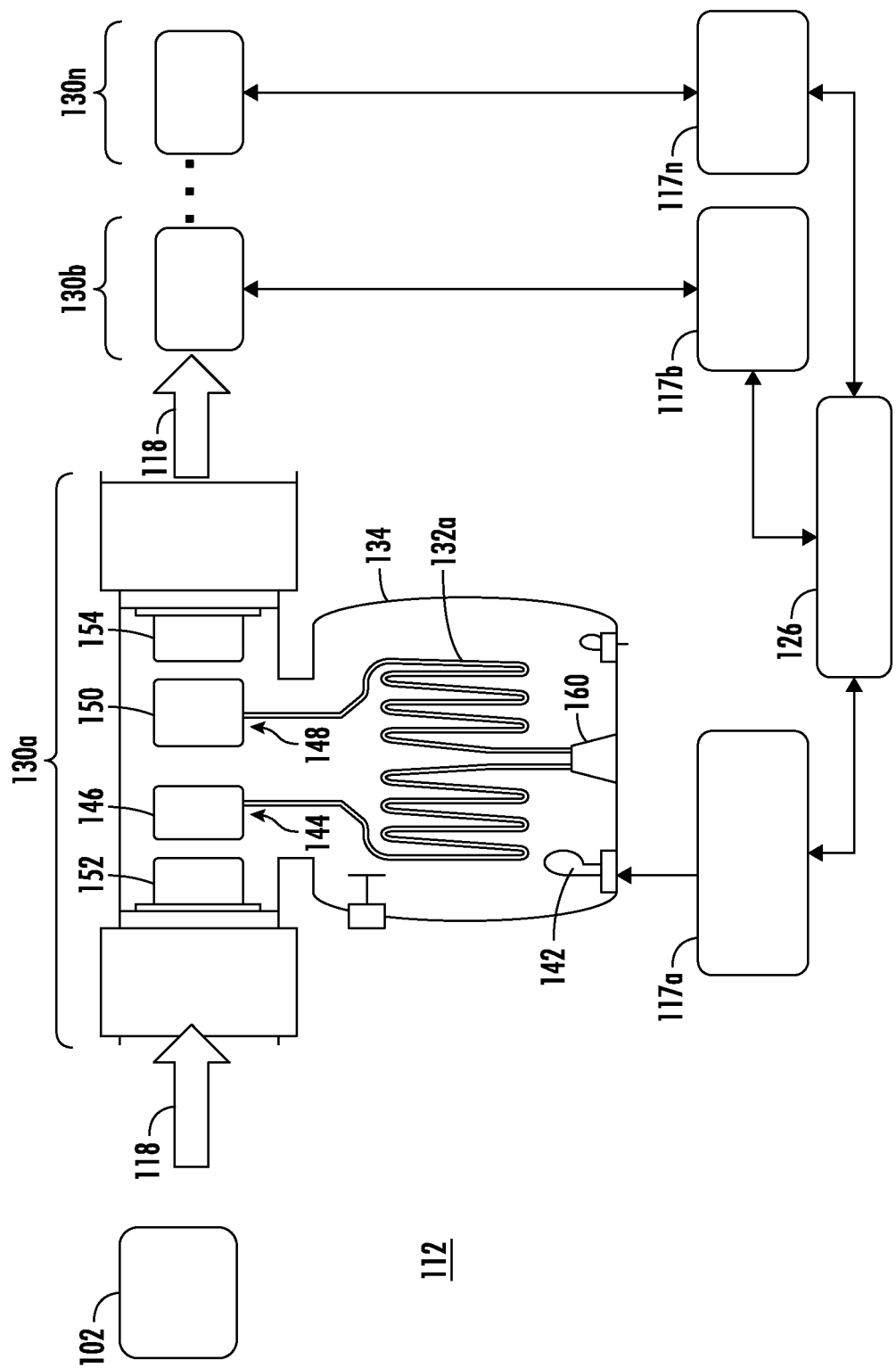
FIG. 2 is a schematic view illustrating a liner accelerator in accordance with an exemplary embodiment of the present disclosure.

Referring to FIG. 2, a schematic view illustrating the linear accelerator 112 of the above-described ion implantation system 100 is shown. The linear accelerator 112 may include a plurality of acceleration stages, shown as acceleration stage 130a, acceleration stage 130b, and acceleration stage 130n. As described above, the acceleration stages 130a, 130b, 130n may be powered by respective, dedicated RF sources 117a, 117b, 117n, where the operation of the RF sources 117a, 117b, 117n may be controlled by the controller 126. As such, the acceleration stages 130a, 130b, 130n may be arranged with a resonator chamber 12 having no insulator surfaces in contact with RF voltage. This feature allows resonator coils of the acceleration stages 130a, 130b, 130n (only resonator coil 132a of the acceleration stage 130a is pictured) to be driven with a relatively higher voltage without causing reliability problems that may arise from breakdown or other damage to insulator surfaces exposed to high voltage. In various alternative embodiments, all of the acceleration stages 130a, 130b, 130n may be powered by a common RF source. The present disclosure is not limited in this regard.

Still referring to FIG. 2, and referring also to the detailed, side view illustrating the acceleration stage 130a shown in FIG. 3, the acceleration stage 130a will now be described in greater detail. The acceleration stages 130b, 130n are generally identical to the acceleration stage 130a. Thus, the following description of the acceleration stage 130a shall also apply to the acceleration stages 130b, 130n.

The acceleration stage 130a may include a resonator chamber 134 maintained under vacuum as a vacuum chamber when used to accelerate an ion beam. The acceleration stage 130a may further include a resonator 114a, including a resonator coil 132a and a conductive base 160. The resonator coil 132a may be formed of conductive materials in order to generate an oscillating voltage that is applied to an electrode assembly 140.

The electrode assembly 140 may be arranged as a drift tube arrangement to conduct an ion beam therethrough, as known in the art. While an ion beam is conducted through the electrode assembly 140, the ion beam is accelerated according to the oscillating voltage applied to the electrode assembly 140 by the resonator 114a. The resonator 114a may be disposed in the resonator chamber 134 and may receive an RF power signal from an exciter 142. The resonator 114a may couple to the exciter 142 via a magnetic field and may consequently generate an RF output signal at a frequency of the RF power signal. At a given upper terminal of the resonator coil 132a, the RF output signal will be received as an RF voltage at a given RF electrode of the electrode assembly 140. A maximum amplitude of this voltage will depend upon the amplitude of the exciter 142 power. In the embodiment shown in FIG. 3, a first terminal 144 of the resonator coil 132a may be directly connected to a first RF electrode 146 of the electrode assembly 140, while a second terminal 148 of the resonator coil 132a may be directly connected to a second RF electrode 150 of the electrode assembly 140. The electrode assembly 140 may further include third and fourth RF electrodes 152, 154 flanking the first and second RF electrodes 146.

Figure 3:
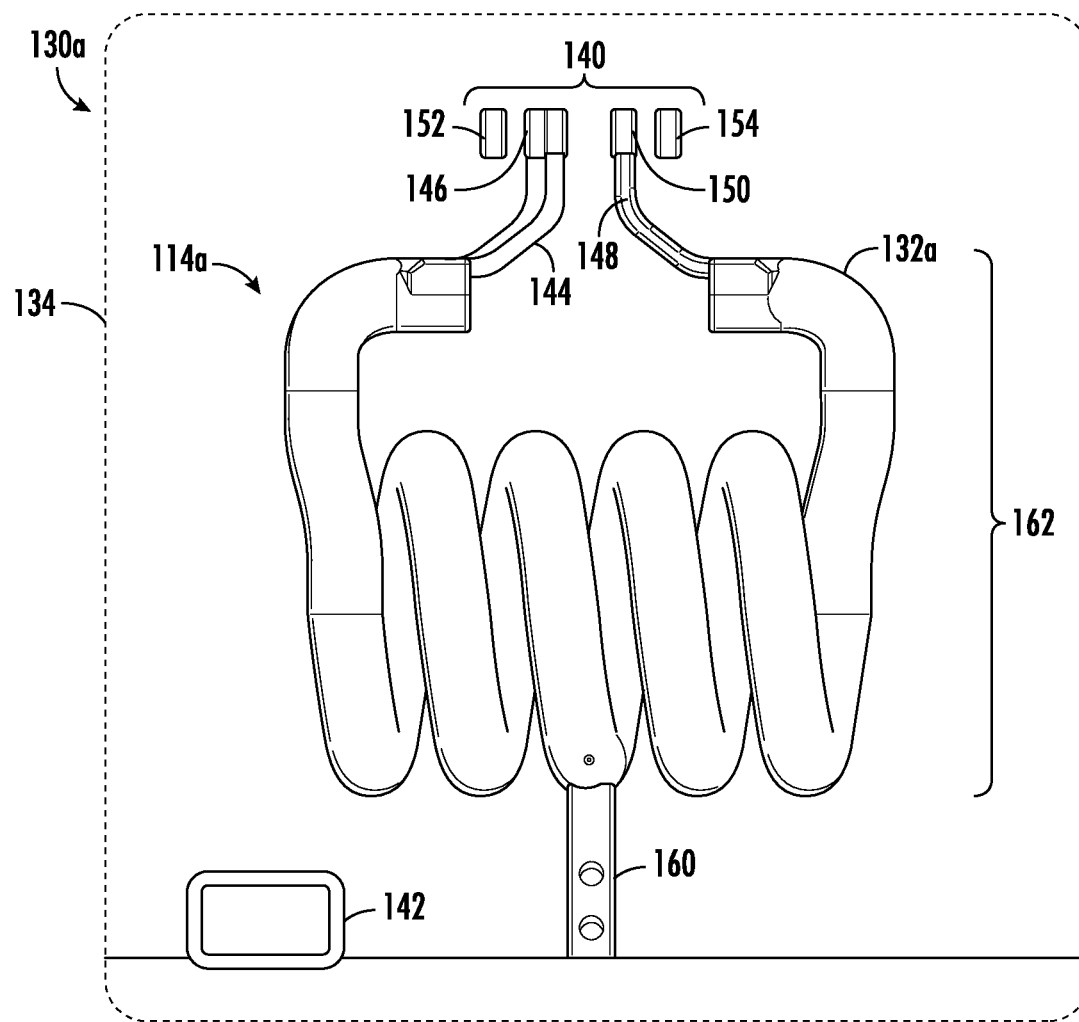

In the configuration of FIG. 3, the resonator 114a may be arranged to mechanically support an RF electrode of the electrode assembly 140, in this case, first RF electrode 146 and second RF electrode 150. In particular, a conductive base 160 may be arranged to support the resonator coil 132a, and in turn, the resonator coil 132a will support first the first RF electrode 146 and the second RF electrode 150, via the first terminal 144 and second terminal 148, respectively. For example, the first terminal 144 and the second terminal 148 may be rigid metallic pieces that are in turn rigidly fixed to a main portion 162 of the resonator coil 132a. Thus, the conductive base 160 and the resonator coil 132a may stabilize the first RF electrode 146 and the second RF electrode 148 from movement.

Figure 4:
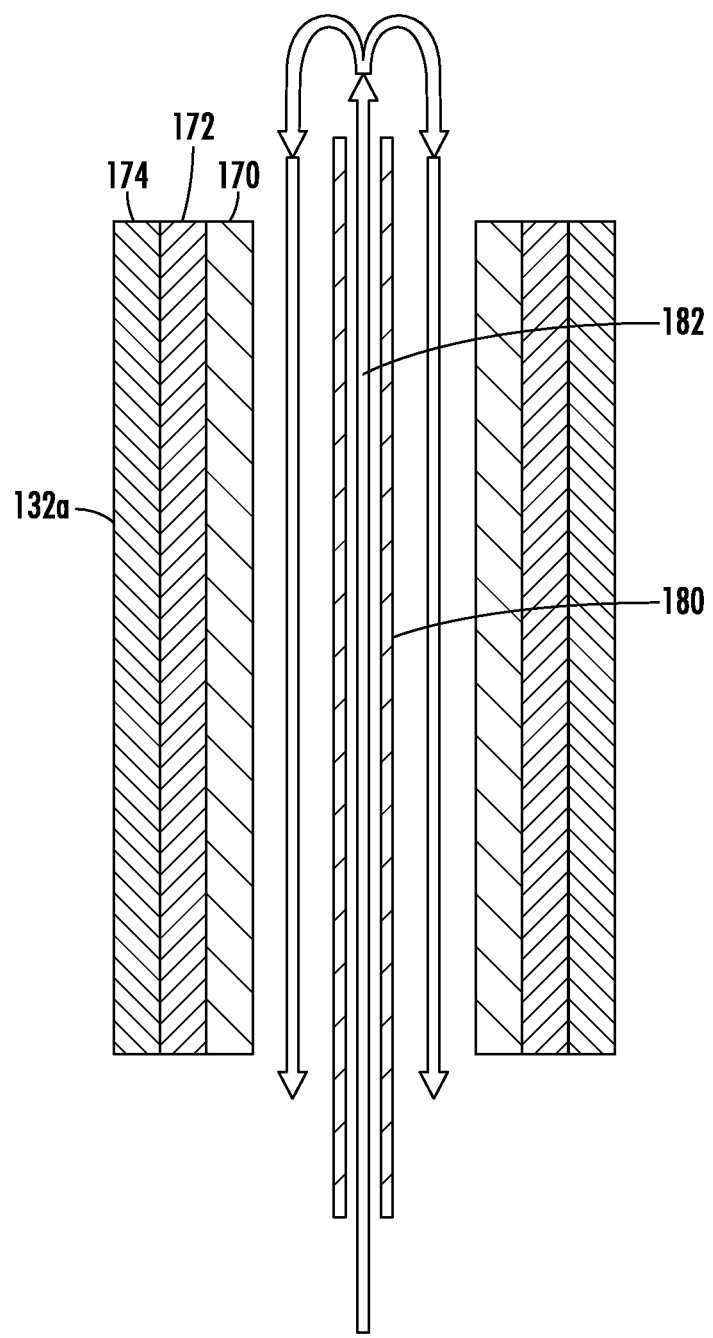
FIG. 4 is a detailed cross-sectional view illustrating a segment of a resonator coil in accordance with an exemplary embodiment of the present disclosure.

Referring to FIG. 4, a cross sectional view illustrating a segment of the resonator coil 132a is shown. The resonator coil 132a may be a tubular structure having a plurality of coaxial layers, including an inner layer 170, a middle layer 172, and an outer layer 174. In various embodiments, the middle layer 172 and the outer layer 174 may be conformal platings or coatings applied to the underlying inner layer 170 and middle layer 172, respectively. The present disclosure is not limited in this regard.

The inner layer 170 of the resonator coil 132a may be formed of a relatively stiff material amenable to bending or forming using CNC processes or the like to produce a coil as shown in FIG. 3. In various embodiments, the resonator coil 132a may be formed of a metal having a greater stiffness than copper. Such metals include, and are not limited to, stainless steel, aluminum, and titanium. In various embodiments, the inner layer 170 may have an outer diameter in a range of 0.08 inches to 1.20 inches, and a wall thickness in a range of about 0.06 inches to about 1 inch. The present disclosure is not limited in this regard.

The middle layer 172 of the resonator coil 132a may be formed of a material having good electrical and thermal conductivity. In various embodiments, the material of the middle layer may have an electrical conductivity in a range of about $3.5 \times 10^7$ siemens/meter to about $6.3 \times 10^7$ siemens/meter. Such materials include, and are not limited to, copper, gold, and silver. In a specific example, the middle layer 172 may be formed of MIL-C-14450B Class 0 copper plating applied to the inner layer 170 using any suitable plating processes. In various examples, the middle layer 172 may have a wall thickness in a range of about 0.002 inches to about 0.008 inches. In a specific example, the middle layer 172 may have a wall thickness of about 0.005 inches. For copper, this thickness represents 5 skin depths at 13.56 MHz. Thus, due to the skin effect, the middle layer 172 may provide the resonator coil 132a with the same or similar shunt impedance of traditional, single layer resonator coils formed entirely of copper.

The outer layer 174 of the resonator coil 132a may be formed of a durable, dielectric material, such as a thermally applied polyimide. Such materials include, and are not limited to, JARO 650-T sold by Jaro Corp, and PARAYLENE sold by SCS. In various examples, the outer layer 174 may have a thickness in a range of about 0.002 inches to about 0.005 inches. The present disclosure is not limited in this regard. The outer layer 174 may provide the metallic middle layer 172 with a protective coating to prevent sputtering of the middle layer 172 during ion implantation processes, thus preventing downstream migration of metal particulate and resulting metal contamination of the substrate 124 (see FIG. 1). Notably, the dielectric material of the outer layer 174 does not reduce the efficiency of the resonator coil 132a in the way aluminum plating would.

In order to dissipate heat generated by power delivered by the resonator coil 132a, the resonator coil 132a may further include a cooling line 180 extending through the hollow interior of the inner layer 170. The cooling line 180 may be a flexible tube, hose, conduit, etc. and may carry a cooling fluid 182 (e.g., water) through the resonator coil 132a. In various embodiments, the cooling fluid 182 may enter the resonator coil 132a via the cooling line 180, may exit an open, terminal end of the cooling line 180, and may flow out of the resonator coil 132a via a return path radially intermediate the cooling line 180 and the inner layer 170 as indicated by the arrows in FIG. 4.

In view of the foregoing, at least the following advantages are achieved by the embodiments disclosed herein. As a first advantage, the multilayer resonator coil 132a of the present disclosure exhibits increased stiffness, and is thus less prone to vibration, relative to traditional copper resonator coils. As a second advantage, the outer layer 174 of the multilayer resonator coil 132a of the present disclosure prevents metal sputtering during ion implantation processes, thus preventing downstream migration of metal particulate and resulting metal contamination of a substrate being processed. Additionally, the aforementioned advantages are realized while maintaining the high shunt impedance and thermal and electrical conductivity of traditional copper resonator coils.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implantation system comprising:
an ion source for generating an ion beam;
an end station for holding a substrate to be implanted by the ion beam; and
a linear accelerator disposed between the ion source and the end station and adapted to accelerate the ion beam, the linear accelerator comprising:
at least one acceleration stage including a resonator and a resonator coil disposed within a resonator chamber, wherein the resonator coil is a tubular body having a plurality of coaxial layers, including an inner layer, a middle layer, and an outer layer, wherein the outer layer is formed of a dielectric material.

2. The ion implantation system of claim 1, wherein the inner layer of the resonator coil is formed of a material having a greater stiffness than copper.

3. The ion implantation system of claim 1, wherein the inner layer of the resonator coil is formed of one of stainless steel, aluminum, and titanium.

4. The ion implantation system of claim 1, wherein the inner layer of the resonator coil has a wall thickness in a range of 0.06 inches to 1 inch.

5. The ion implantation system of claim 1, wherein the middle layer of the resonator coil is formed of a material having an electrical conductivity in a range of $3.5 \times 107$ siemens/meter to $6.3 \times 107$ siemens/meter.

6. The ion implantation system of claim 1, wherein the middle layer of the resonator coil has a wall thickness in a range of 0.002 inches to 0.008 inches.

7. The ion implantation system of claim 1, wherein the middle layer of the resonator coil is formed of copper.

8. The ion implantation system of claim 1, wherein the outer layer of the resonator coil is formed of a polyimide.

9. The ion implantation system of claim 1, wherein the outer layer of the resonator coil has a wall thickness in a range of 0.002 inches to 0.005 inches.

10. The ion implantation system of claim 1, wherein the resonator coil further includes a cooling line extending through a hollow interior of the inner layer.

11. A linear accelerator for an ion implantation system, the linear accelerator comprising at least one acceleration stage including a resonator and a resonator coil disposed within a resonator chamber, wherein the resonator coil is a tubular body having a plurality of coaxial layers, including an inner layer, a middle layer, and an outer layer, wherein the outer layer is formed of a dielectric material.

12. The linear accelerator of claim 11, wherein the inner layer of the resonator coil is formed of a material having a greater stiffness than copper.

13. The linear accelerator of claim 11, wherein the inner layer of the resonator coil is formed of one of stainless steel, aluminum, and titanium.

14. The linear accelerator of claim 11, wherein the middle layer of the resonator coil is formed of a material having an electrical conductivity in a range of $3.5 \times 10^7$ siemens/meter to $6.3 \times 10^7$ siemens/meter.

15. The linear accelerator of claim 11, wherein the middle layer of the resonator coil is formed of copper.

16. The linear accelerator of claim 11, wherein the outer layer of the resonator coil is formed of a polyimide.

17. A resonator coil for a linear accelerator of an ion implantation system, the resonator coil comprising a tubular body having a plurality of coaxial layers, including an inner layer, a middle layer, and an outer layer, wherein the inner layer is formed of one of stainless steel, aluminum, and titanium, the middle layer is formed of copper, and the outer layer is formed of a dielectric material.

18. The resonator coil of claim 17, wherein the inner layer of the resonator coil has a wall thickness in a range of 0.06 inches to 1 inch.

19. The resonator coil of claim 17, wherein the middle layer of the resonator coil has a wall thickness in a range of 0.002 inches to 0.008 inches.

20. The resonator coil of claim 17, wherein the outer layer of the resonator coil has a wall thickness in a range of 0.002 inches to 0.005 inches.

* * * * *